(12) United States Patent
Okino

(10) Patent No.: US 6,194,732 B1
(45) Date of Patent: Feb. 27, 2001

(54) CHARGED-PARTICLE-BEAM EXPOSURE METHODS WITH BEAM PARALLELISM DETECTION AND CORRECTION

(75) Inventor: Teruaki Okino, Kamakura (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/222,338

(22) Filed: Dec. 28, 1998

(30) Foreign Application Priority Data

Dec. 25, 1997 (JP) ........................................ 9-366306

(51) Int. Cl.$^7$ ................................................ H01J 37/304
(52) U.S. Cl. .................................. 250/491.1; 250/492.2; 250/492.23
(58) Field of Search ............................ 250/491.1, 492.2, 250/492.23, 398

(56) References Cited

U.S. PATENT DOCUMENTS 4,199,688 * 4/1980 Ozasa ................................ 250/492.2
4,443,704 * 4/1984 Yamashita et al. .............. 250/491.1
5,936,252 * 8/1999 Stickel et al. .................... 250/492.23

OTHER PUBLICATIONS

Sturans et al., "Optimization of Variable Axis Immersion Lens for Resolution and Normal Landing," *J. Vac. Sci. Technol.* 6:1682–1685 (1990).

* cited by examiner

Primary Examiner—Jack Berman
(74) Attorney, Agent, or Firm—Klarquist Sparkman Campbell Leigh & Whinston LLP

(57) ABSTRACT

Methods are disclosed for transferring a pattern from a mask to a sensitive substrate. The mask is illuminated substantially orthogonally with a charged particle beam propagating along an optical axis. An image of the charged particle beam that has passed through the mask is projection-exposed onto the substrate. At multiple locations displaced from each other in the optical-axis direction, a size measurement is obtained on a transverse profile of the beam as incident on at least one of the mask and substrate. From the size measurements, a respective parallelism of the beam incident to the mask and/or substrate is determined. From these determinations, the parallelism of the beam relative to the mask and/or substrate is adjusted as required.

30 Claims, 6 Drawing Sheets

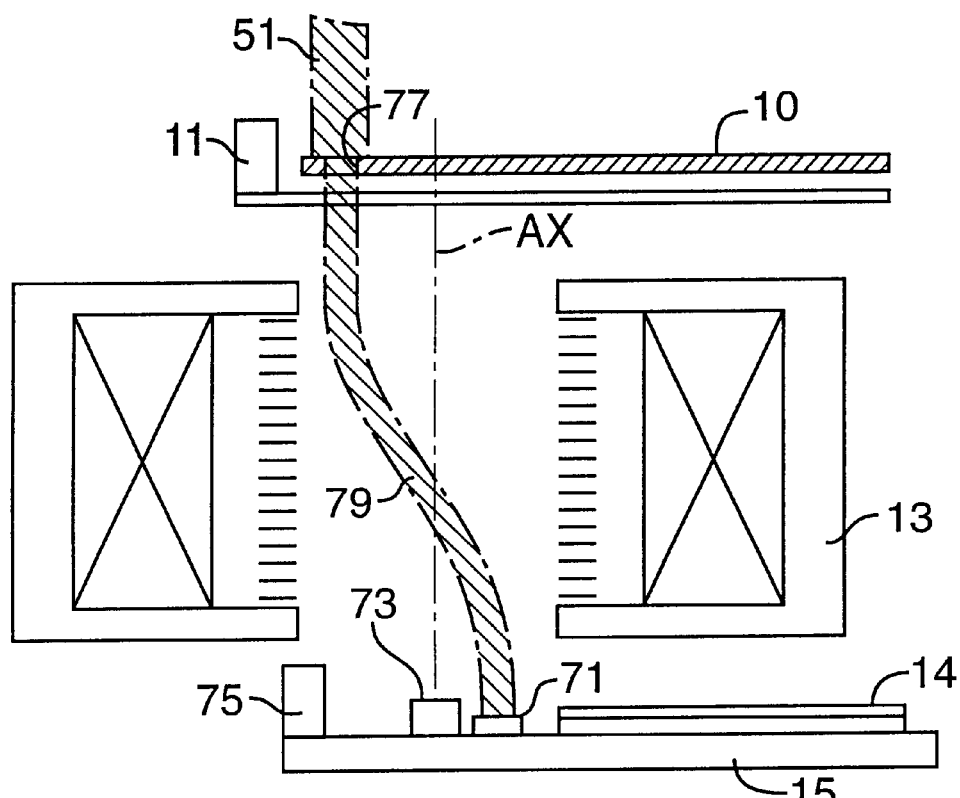
FIG. 3(A)
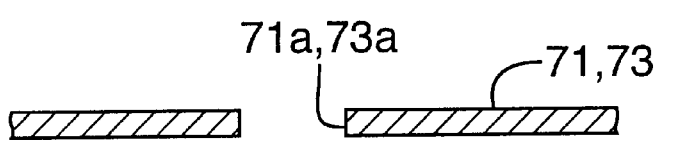
FIG. 3(B)  FIG. 3(C)
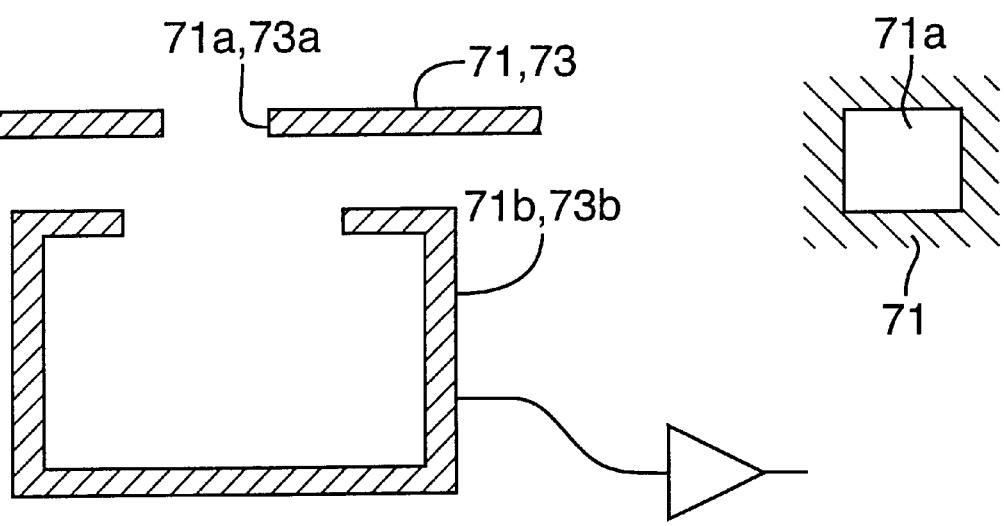

CHARGED-PARTICLE-BEAM EXPOSURE METHODS WITH BEAM PARALLELISM DETECTION AND CORRECTION

FIELD OF THE INVENTION

This invention pertains to microlithographic projection-exposure apparatus and methods employing a charged particle beam, such as an electron beam or ion beam, for projecting a pattern defined by a mask or reticle onto a sensitive substrate. Such apparatus and methods are primarily used in the manufacture of semiconductor devices. More specifically, the invention pertains to charged-particle-beam (CPB) projection-exposure apparatus and methods exhibiting reduced exposure-pattern defocusing and distortion compared to conventional apparatus and methods, while exhibiting improved fidelity and stitching accuracy of projected pattern portions.

BACKGROUND OF THE INVENTION

Relevant conventional apparatus and methods are exemplified by certain electron-beam projection-exposure apparatus. Projection-exposure using an electron beam is highly accurate but current methods are flawed by low throughput, and various approaches have been investigated in attempts to solve such problems. For example, various "batch"-type projection-exposure systems, termed "cell-projection," "character projection," or "block exposure" systems, have been developed. With such systems, a circuit pattern comprising a large number of repeating units of a particular arrangement of features is defined on a mask. Such a circuit pattern is typical of, for example, memory chips. The entire mask is not exposed in one exposure (or "shot") but rather one unit at a time in a repeating manner onto the substrate. As projected onto the substrate, each unit measures, e.g., about 10 µm by 10 µm square. However, such systems exhibit difficulty in projecting non-repeated areas of the circuit pattern.

Current efforts in the microlithography industry have been directed to the development of electron-beam projection-exposure apparatus that perform "demagnifying" projection-exposure (i.e., exposure in which the projected image of the mask is demagnified relative to the mask) of the mask pattern at much higher throughput than the batch-type systems summarized above. Various approaches have been investigated in which the mask defines the entire circuit pattern for a chip. In one approach, the electron beam is irradiated only on a certain portion of the overall mask pattern at any one instant, and an image of the irradiated portion is demagnified and "transferred" to (i.e., projection-exposed onto) the substrate using a projection lens. If one were to attempt to transfer, using such an apparatus, the entire mask pattern to the substrate in one shot, the entire mask pattern would not be transferred with sufficient accuracy. In addition, preparation of a mask for use in such an apparatus is very difficult.

Therefore, systems that are the subject of the most recent active research are not those in which the entire die pattern (or even multiple die patterns) is exposed in one shot. Rather, the most current approaches are directed to systems in which the projection optical system has a large optical field and the mask pattern is divided into multiple "subfields" that are projection-exposed one subfield at a time onto the substrate. Such systems are termed "divided" projection-exposure systems. With a divided projection-exposure system, exposure of each mask subfield is performed while correcting projection aberrations, such as image focus or field distortion, etc. Thus, projection-exposure can be performed with better image resolution and accuracy across an optically wider field than with systems that projection-expose an entire die in one shot.

In most conventional batch-type and divided projection-exposure systems, the projection-optical system projects a demagnified image of the irradiated portion of the mask onto the substrate. At the mask surface, if all locations of the transverse area of the beam used to illuminate the mask are not incident exactly orthogonally (i.e., telecentrically) at the mask surface, the trajectory of the beam between the mask and the substrate will not be ideal and more aberrations will be manifest.

In addition, at the substrate surface, if all locations of the transverse area of the beam used to project the image onto the substrate surface are not incident exactly orthogonally (i.e., telecentrically) on the substrate surface, problems will arise such as variations in image size as projected and/or image rotation at each transferred subfield, especially if the substrate surface exhibits any variation in elevation relative to the focusing plane of the projection-optical system. Such problems can seriously undermine, for example, the accuracy with which transferred subfields are "stitched" together on the substrate surface.

With semiconductor devices that require highly accurate fabrication, such as 1-Gbit and 4-Gbit DRAMs, the accuracy with which transferred subfields must be positioned and stitched together on the substrate surface is extremely high: about 10 to 30 nm. Therefore, it is becoming increasingly crucial, in such systems, to increase the accuracy with which all portions of the transverse area of the beam are incident orthogonally to the mask and substrate, and to be able to measure such orthogonality with high accuracy.

Conventionally, incidence orthogonality of the center of a beam flux is measured as described in Sturans et al., "Optimization of Variable Axis Immersion Lens For Resolution and Normal Landing," J. Vac. Sci. Technol. B8(6) :1682–1685 (Nov./Dec., 1990). According to the method disclosed in that paper, a variable-shaped beam is projected onto the substrate. The size of the imaged pattern is controlled by shaping deflectors. Incidence orthogonality of the beam is measured only at the center of the beam flux. Unfortunately, in divided projection-transfer systems, such corrections cannot be realized.

SUMMARY OF THE INVENTION

The shortcomings of conventional methods as summarized above are addressed by methods according to the present invention.

A first representative embodiment of the invention is directed to certain improvements in a method for transferring a pattern from a mask to a sensitive substrate. In the method the mask defining the pattern is illuminated substantially orthogonally with a charged particle beam, and an image of the charged particle beam that has passed through the mask is projection-exposed onto the sensitive substrate. At each of multiple locations, at about "mask level" but displaced from each other in an optical-axis direction, a beam-parallelism measurement is obtained from a transverse profile of the charged particle beam; this profile is obtained from a measurement of two opposite-edge positions of the illumination beam at the mask. From data concerning these positional measurements, a respective parallelism of the charged particle beam as incident at the mask is determined. Based on these determinations, the parallelism of the charged particle beam incident to the mask is adjusted as required to reduce an error in the parallelism found as a result of the determinations. After performing the beam-parallelism adjustment, a projection-exposure can be performed of the substrate with the pattern defined by the mask.

According to a second representative embodiment, the mask defining the pattern is illuminated with a charged particle beam, and an image of the charged particle beam that has passed through the mask is projection-exposed substantially orthogonally onto the sensitive substrate. At each of multiple locations, at about "substrate level" but displaced from each other in an optical-axis direction, a beam-parallelism measurement is obtained from a transverse profile of the charged particle beam; this profile is obtained from a measurement of two opposite-edge positions of the illumination beam at the substrate. From data concerning these positional measurements, a respective parallelism of the charged particle beam incident at the substrate is determined. Based on these determinations, the parallelism of the charged particle beam incident at the substrate is adjusted as required to reduce an error in the parallelism found as a result of the determinations. After performing the beam-parallelism adjustment, a projection-exposure can be performed of the substrate with the pattern defined by the mask.

To facilitate measurement of beam parallelism in the first and second embodiments, first and second marks can be provided at locations $Z_1$ and $Z_2$, respectively, on the mask or mask stage, or the substrate or substrate stage, respectively. A charged particle beam is directed at each of the first and second marks. The charged particle beam has a transverse profile having first and second edges in one direction. The charged particle beam and each of the first and second marks separately are scanned relative to each other to obtain a positional measurement on each of the first and second edges at each of the first and second marks.

The charged particle beam and each of the first and second marks are scanned relative to each other preferably in two directions (x and y) orthogonal to each other and to the optical axis (which extends in the z direction). In such an instance, the scanning in the two orthogonal directions and at each of the locations $Z_1$ and $Z_2$ can yield measurements of transverse widths $X_{z1}$, $X_{z2}$ of the beam in the x direction at the locations $Z_1$ and $Z_2$, respectively, and measurements of transverse widths $Y_{z1}$, $Y_{z2}$ of the beam in the y direction at the locations $Z_1$ and $Z_2$, respectively. The beam-parallelism error ($E_x$) in the x direction is determined according to the expression:

$$E_x = (X_{z2} - X_{z1})/(Z_2 - Z_1)$$

and the beam-parallelism error ($E_y$) in the y direction is determined according to the expression:

$$E_y = (Y_{z2} - Y_{z1})/(Z_2 - Z_1)$$

An edge of the beam can be detected by determining a scanning position at which, on a plot of the first-order differential of the signal intensity versus beam position, a half-full amplitude is obtained.

Detection is preferably performed by a charged-particle detector.

After beam parallelism has been determined and corrected as required, a projection-exposure of the substrate can be performed with the pattern defined by the mask.

A third representative embodiment of a method according to the invention is also directed to certain improvements in a method for transferring a pattern from a mask to a sensitive substrate. In a first step, multiple beamlet patterns are provided at a "mask level" (e.g., on the mask or mask stage). Preferably, four beamlet patterns are arranged near respective edges of a small field at the mask level, providing two "x-oriented" beamlet patterns and two "y-oriented" beamlet patterns. Each beamlet pattern is preferably configured to produce multiple beamlets. Whenever a beamlet pattern is irradiated by the charged particle beam, the resulting beamlet(s) propagate downstream of the mask level and produce a corresponding beamlet-pattern image. Multiple marks (preferably at least one "x-oriented" mark and at least one "y-oriented" mark) are provided at each of different locations $Z_1$ and $Z_2$ at about a "substrate level" (e.g., the substrate or substrate stage). The locations $Z_1$, $Z_2$ are displaced from each other in the z-direction. Each mark preferably comprises a number of "marklets" corresponding to the number of beamlets in a corresponding beamlet-pattern image. In a next step, a mark is situated near a corresponding first beamlet-pattern image and the beamlet-pattern image and the respective mark are scanned relative to each other to obtain a positional measurement of the beamlet-pattern image on the mark. In a next step, the substrate stage is moved so as to situate the mark near a corresponding second beamlet-pattern image, and a positional measurement is obtained in the same manner as with the first beamlet-pattern image. Preferably, similar measurements are obtained for each of the x-oriented beamlet-pattern images (using the x-oriented mark) and each of the y-oriented beamlet-pattern images (using the y-oriented mark). Similar measurements are performed at each of the first and second locations $Z_1$, $Z_2$. From data concerning these positional measurements a respective parallelism of the charged particle beam incident to the mask is determined. Based on these determinations the parallelism of the charged particle beam is adjusted as required to reduce an error in the parallelism found as a result of the determinations. In this embodiment, the marks can be individually positioned in the vicinity of respective beamlet-pattern images by moving at least one of the mask stage and the substrate stage in respective directions orthogonal to the optical axis.

As a result of the improved methods provided by the present invention, charged-particle-beam (CPB) projection-exposure can be performed with reduced defocusing and distortion in the exposure pattern, and improved positional and stitching accuracy of transferred subfields on the substrate surface.

It will be appreciated that the "mask" referred to in the following specification encompasses plates defining variable-shaped apertures.

If a charged-particle beam is propagating exactly parallel to the optical axis, the cross-sectional shape (transverse profile) and transverse dimensions of the beam should be the same at each of multiple locations along the optical axis. Therefore, according to the invention, the transverse profile and dimensions of the charged particle beam as used to illuminate the mask and/or the sensitive substrate are measured at multiple locations along the optical axis. If any parallelism error is detected, the error can be reduced by adjusting any of various lenses and deflectors comprising the CPB optical system. Ideally, such adjustments result in the same measurements being obtained at each of the multiple locations. Thus, the parallelism of the beam incident to the mask and/or the substrate can be adjusted with high accuracy and precision, thereby reducing aberrations, defocusing, and distortion of the exposure pattern. In addition, positioning and stitching of transferred subfields can be achieved with improved accuracy and precision compared to conventional methods.

The foregoing and additional features and advantages of the invention will be more readily apparent from the following detailed description, which proceeds with reference to the accompanying drawings.

BRIEF DESCRIPTION OF THE DRAWINGS

FIG. 2(A) is a plot of electron-beam intensity; FIG. 2(B) is a plot of the first-order differential of the plot of FIG. 2(A); and FIG. 2(C) is a plot of the second-order differential of the plot of FIG. 2(A).

FIGS. 3(A)–3(C) depict certain aspects of the second example embodiment. FIG. 3(A) is an elevational section of the region between the mask stage and the substrate stage; FIG. 3(B) is an elevational section of certain details of the marks used in this example embodiment for measuring parallelism of the charged particle beam incident to a wafer or other substrate irradiated by the charged particle beam; and FIG. 3(C) is a plan view of the transverse profile of a mark.

FIG. 4(A) is a plan view of beamlet patterns that would be situated at "mask level" (e.g., on a mask or on a mask stage); FIG. 4(B) is a plan view of marks, located at about "substrate level" (e.g., on the substrate or substrate stage), each corresponding to a beamlet-pattern image produced by passage of the charged particle beam through a corresponding beamlet pattern; and FIG. 4(C) is a plan view of a beamlet-pattern image being scanned relative to a respective mark.

FIG. 5(A) is a plot of signal intensity, and FIG. 5(B) is a plot of the auto-correlation waveform of the signal.

DETAILED DESCRIPTION

Figure 1A:
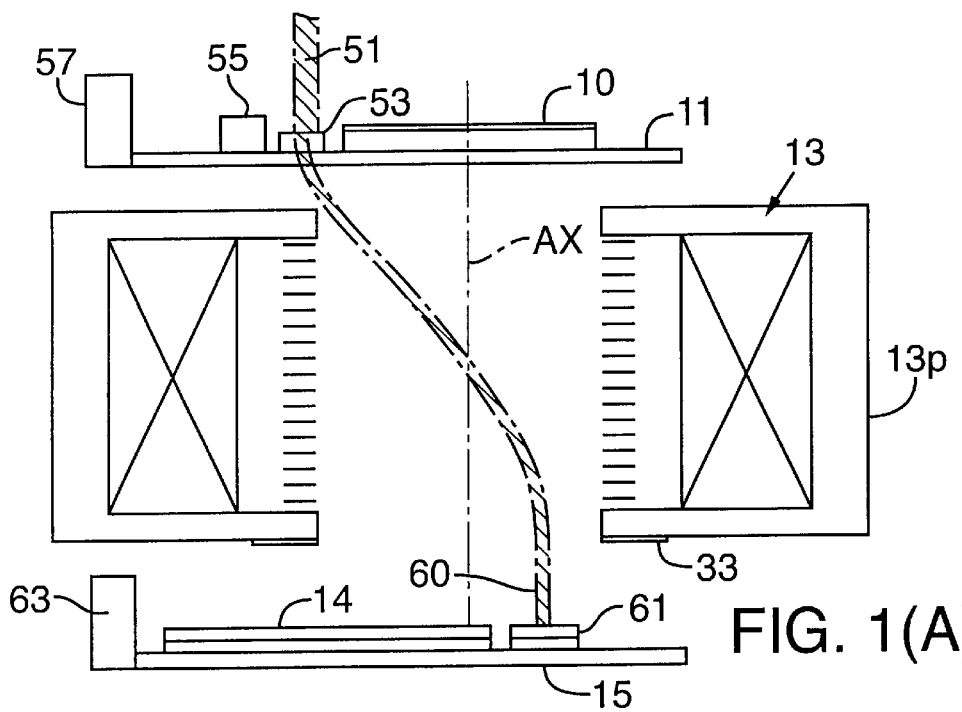
FIG. 1(A) is an elevational sectional view of a region of FIG. 6 situated between the mask stage 11 and the substrate stage 15.

According to a first embodiment of a method according to the invention, a charged particle beam is used to perform projection-exposure of a mask pattern to a sensitive substrate. The charged particle beam (e.g., electron beam) is produced by a suitable source (e.g., electron gun) that causes the beam to propagate generally in a z-axis direction relative to the x- and y-axis directions in which the mask and substrate extend. The z-axis direction is parallel to an optical axis of the system. After passing through the mask, the charged particle beam passes through a projection-lens system that produces a demagnified image, on the substrate, of the portion of the mask irradiated by the charged particle beam.

Marks are provided at multiple locations along the z-axis direction (the locations representing different locations in the direction of the optical axis) in the trajectory of the charged particle beam. For example, marks can be provided at a mask plane (e.g., on a mask or on a stage used for holding the mask). The marks are used so as to measure the positions of, preferably, opposing edges of the transverse profile of the charged particle beam relative to the marks at the different locations along the z-axis. The parallelism of the charged particle beam is determined from the detected beam-edge positions at the various positions along the z-axis direction. Based on such measurements, the parallelism of the charged particle beam incident to the mask and/or substrate can be adjusted as required to ensure accurate exposure for pattern transfer.

The mask stage preferably comprises a mechanism that moves the mask stage in the x-, y-, and/or z-axis direction as required to properly position marks for scanning and to achieve accurate focusing. With such a mechanism, the mask stage can include a single mark (as opposed to multiple marks) that can be measured at different locations in the z-axis direction by shifting the mask stage to each of multiple positions in the z-axis direction.

According to a second embodiment of a method according to the invention, a charged particle beam is used to perform projection-exposure of a mask pattern to a sensitive substrate. In the second embodiment, marks are provided at a substrate plane (e.g., on the substrate or on the substrate stage) at different locations in the direction of the optical axis (z-axis). The beam or marks are scanned relative to each other and to the beam to measure the relative positions of, preferably, opposing edges of the incident beam relative to the marks at the different locations in the z-axis direction. The parallelism of the beam is measured from the beam-edge positions at the different locations in the z-axis direction. The parallelism of the beam on the sensitive substrate is adjusted as required based on the measurement results, followed by actual projection-exposure.

The substrate stage can comprise a mechanism that accurately moves the substrate stage in the direction of the optical axis (z-axis direction). With such a mechanism, a mark on the substrate or substrate stage can be measured by shifting the substrate stage to any of multiple positions in the direction of optical axis.

With respect to either embodiment, the marks are preferably located at positions of different "height" ($Z_1$, $Z_2$) (i.e., different positions in the z-axis direction) on the mask plane or substrate plane. The respective marks at $Z_1$ and $Z_2$ are sequentially positioned in the vicinity of each edge (in the x- and y-axis directions) of the beam (e.g., a beam having a square transverse profile). The relative positions of the marks and each edge are measured. The various transverse widths ($X_{z1}$, $Y_{z1}$, $X_{z2}$, $Y_{z2}$) of the beam are obtained from these measurement results. The parallelism of the beam can then be calculated from the various beam widths measured at $Z_1$ and $Z_2$.

The beam-parallelism error ($E_x$) in the x-axis direction is expressed as:

$$E_x = (X_{z2} - X_{z1})/(Z_2 - Z_1) \qquad (1)$$

and the beam-parallelism error ($E_y$) in the y-axis direction is expressed as:

$$E_y = (Y_{z2} - Y_{z1})/(Z_2 - Z_1) \tag{2}$$

These concepts are explained further below, referring to the figures.

Figure 6:
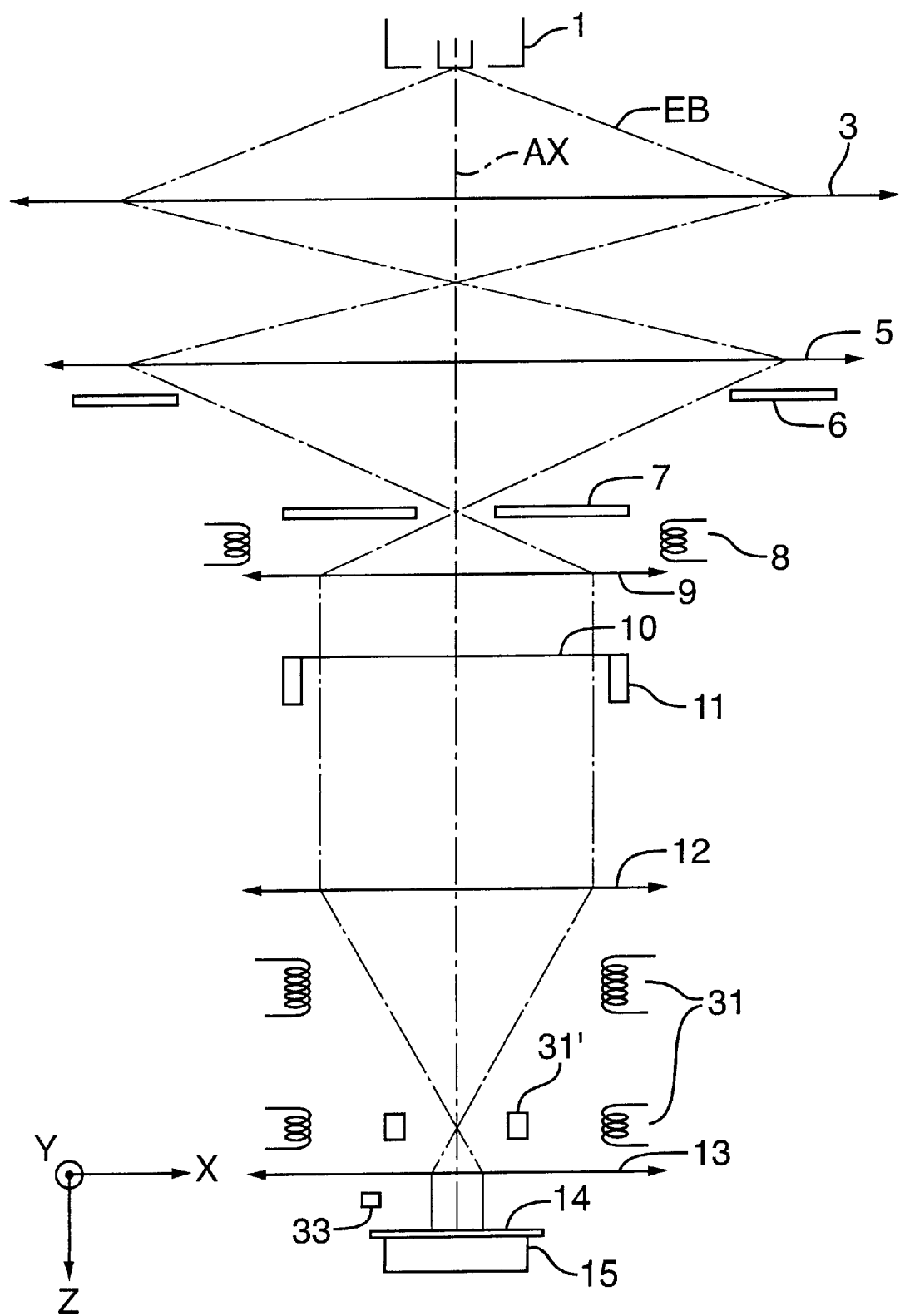
FIG. 6 depicts certain imaging relationships in a projection-exposure apparatus according to the invention.

FIG. 6 depicts certain imaging relationships in a projection-exposure apparatus according to the invention. The FIG. 6 apparatus utilizes an electron beam as a representative charged particle beam. The electron beam EB is produced by an electron gun 1 and propagates downward in the figure along the optical axis AX extending in the z-axis direction. First and second condenser lenses 3, 5, respectively, are situated downstream of the electron gun 1. The electron beam EB passes through the condenser lenses 3, 5 and forms a crossover at a blanking aperture 7.

A subfield-limiting aperture 6 (preferably square in x-y profile) is situated downstream of the second condenser lens 5. The subfield-limiting aperture 6 normally passes only the portion of the electron beam having a transverse profile sufficient to illuminate no more than one mask subfield. For example, the subfield-limiting aperture 6 shapes the electron beam EB to have a square x-y profile dimensioned to illuminate a 1 mm×1 mm square subfield at the mask. A condenser lens 9 forms an image of the subfield-limiting aperture 6 on the mask 10.

The blanking aperture 7 is situated downstream of the subfield-limiting aperture 6 at the axial location where the electron beam forms the crossover. A subfield-selection deflector 8 is situated downstream of the blanking aperture 7. The subfield-selection deflector 8 primarily scans the electron beam EB in the x-direction in FIG. 6 so as to sequentially illuminate the mask subfields one by one within the optical field. A condenser lens 9 is situated downstream of the subfield-selection deflector 8. The condenser lens 9 collimates the electron beam and, when the electron beam strikes the mask 10, causes the beam to form an image of the subfield-limiting aperture 6 on the mask 10.

The portion of the mask 10 shown in FIG. 6 is substantially only one subfield situated on the optical axis AX. However, it will be understood that the mask 10 typically comprises multiple subfields in an array that extends in the x- and y-axis directions orthogonal to the optical axis AX. To individually illuminate each subfield for exposure, the electron beam EB is deflected as required by the subfield-selection deflector 8, as described above.

The mask 10 is mounted on a mask stage 11 that is normally movable in the x- and y-axis directions. A sensitive substrate (also termed "wafer") 14, the surface of which is exposed with images of the mask subfields, is mounted on a substrate stage 15 that is also normally movable in the x- and y-axis directions. By scanning the mask stage 11 and substrate stage 15 in opposing y-axis directions, the various mask subfields within the die pattern defined by the mask are sequentially exposed. Accurate positional measurements of the mask stage 11 and substrate stage 15 in the x- and y-axis directions are obtained using respective laser interferometers (not shown) as known in the art.

First and second projection lenses (also termed "objective lenses") 12, 13, respectively, and a deflector 31 are situated downstream of the mask 10. As each mask subfield is irradiated by the electron beam EB and projected using the projection lenses 12, 13, a demagnified image of the irradiated mask subfield is formed at a desired location ("transfer subfield") on the substrate 14. The upstream-facing surface of the substrate is typically coated with a suitable "resist". By dosing the resist using the electron beam that has passed through an irradiated mask subfield, a demagnified image of the irradiated mask subfield is imprinted on the substrate surface.

By a combination of accurate positioning of the mask stage 11 and substrate stage 15 and operation of various deflectors disposed along the optical axis, the subfields on the mask 10 are sequentially projection-exposed onto corresponding transfer subfields on the substrate 14 and contiguously "stitched" together on the substrate 14 to produce the die pattern on the substrate.

Figure 1B:
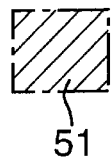
FIG. 1(B) is a plan view of a representative transverse (i.e., orthogonal to the optical axis AX) profile of an electron beam EB as the electron beam illuminates a selected mask subfield.
Figure 1C:
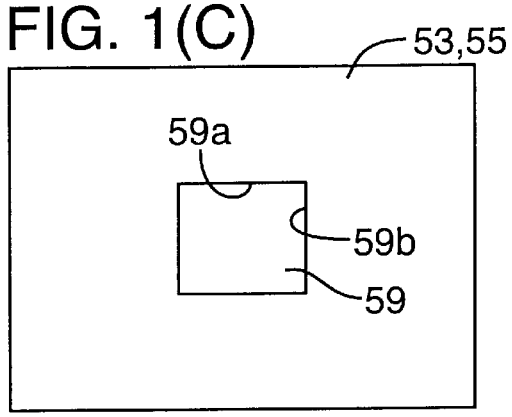
FIG. 1(C) is a plan view of a representative mark used for measuring parallelism, according to the invention, of the charged particle beam incident to a region of the mask being illuminated by the beam.
Figure 1D:
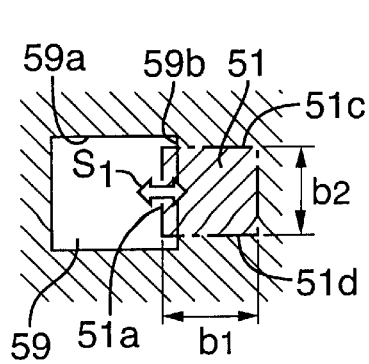
FIGS. 1(D)–1(E) are plan views showing a mark (of the type shown in FIG. 1(C)) being scanned by the charged particle beam.
Figure 1E:
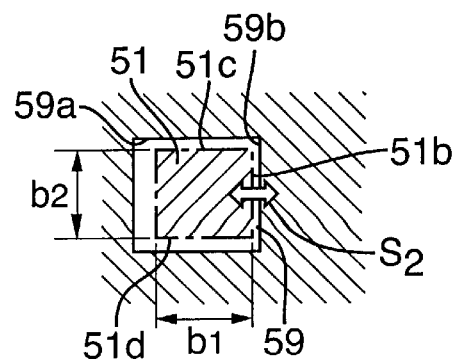

Turning now to FIGS. 1(A)–1(E), various features of a first example embodiment of the invention are shown. FIG. 1(A) is an elevational sectional view of a region of FIG. 6 situated between the mask stage 11 and the substrate stage 15; FIG. 1(B) is a plan view of a representative transverse (orthogonal to the optical axis AX) profile of an electron beam EB (as a representative charged particle beam) as the electron beam illuminates a selected mask subfield; FIG. 1(C) is a plan view of a representative mark (discussed below); and FIGS. 1(D) and 1(E) are plan views of a mark (of the type shown in FIG. 1(C)) being scanned by the charged particle beam.

FIG. 1(A) shows, inter alia, the mask 10 and mask stage 11. The mask 10 is locally illuminated by an "illumination beam" 51 that, in this example embodiment, has a 1200 $\mu$m×1200 $\mu$m square transverse profile as shown in FIG. 1(B). (The illumination beam 51 is the charged particle beam that illuminates the selected mask subfield.) Two marks 53, 55 are situated on the mask stage 11 between the mask 10 and a laser mirror 57. (The laser mirror 57 is used in conjunction with a laser interferometer (not shown) for determining the position of the mask stage 11.)

The marks 53, 55 are preferably made from respective square metallic plates that extend within a respective x-y plane orthogonal to the optical axis (FIG. 1(C)). At the center of each mark 53, 55 is a respective aperture 59 each measuring (in this example embodiment) approximately 1,600 $\mu$m×1600 $\mu$m square. Each of two of the intersecting edges 59a, 59b of the aperture 59 are precision-finished to a knife edge. The two marks 53, 55 are situated at different "heights" relative to each other (i.e., at different locations along the z-axis direction parallel to the optical axis, see FIG. 1(A)).

The mask stage 11 is movable to move each mark 53, 55 individually to a position at which the respective mark will be struck by the illumination beam 51. Then, either the mask stage 11 is laterally moved and/or the illumination beam 51 is laterally deflected to sweep the beam 51 over the respective aperture 59 of the positioned mark 53, 55. Preferably, the mask stage 11 is moved because such movement can be performed at a higher positional accuracy than lateral deflection of the illumination beam 51. Also, calibration of mask-stage movement is simpler to perform than calibration of lateral beam deflection.

In FIG. 1(D) the left edge 51a of the illumination beam 51 is scanning (arrow $s_1$) across the knife edge 59b, and in FIG. 1(E), the right edge 51b of the illumination beam 51 is scanning (arrow $s_2$) across the knife edge 59b. By performing such scanning and other steps as described below, the relative positions of the left and right beam edges 51a, 51b, respectively, and the lateral distance (beam width) $b_1$ between the edges 51a, 51b of the beam 51 can be determined. Similarly, the positions of the "upper" and "lower" beam edges 51c, 51d and the beam width $b_2$ between such edges can be determined by scanning the illumination beam 51 in the up and down directions in FIGS. 1(E) and 1(D) over the knife edge 59a.

A reflective plate 61, made of a "heavy" metal such as tantalum (Ta) or the like, is situated on the substrate stage 15. A portion 60 of the illumination beam 51 that has struck the positioned mark 53, 55 and that has passed through the respective aperture 59 is directed to the reflective plate 61 by the first projection lens 12 (not shown in FIG. 1(A)), the second projection lens 13, and a deflector (not shown). The reflective plate 61 is sufficiently large to completely cover the position at which the electron beam, which has passed through the positioned mark 53, 55, is incident. The reflective plate is appropriately positioned by movement of the substrate stage 15.

A backscattered-electron detector 33 is situated below the second projection lens 13 on the bottom surface of the magnetic pole 13p of the lens. At least a portion of the electron beam 60 backscattered by the reflective plate 61 is detected by the backscattered-electron detector 33, enabling the intensity of the electron beam that has passed through the mark 53, 55 to be detected as an electrical signal.

Figure 2A:
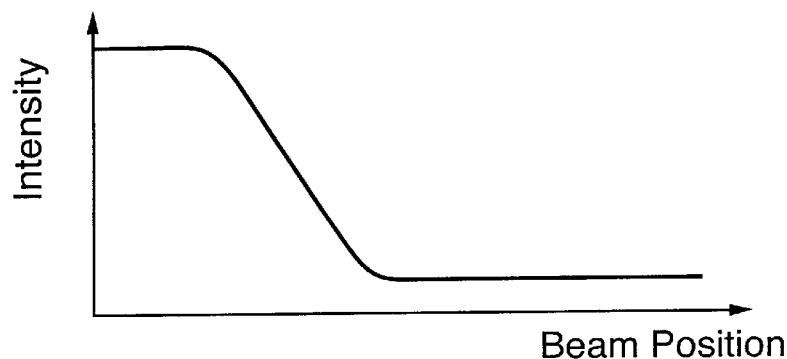
FIGS. 2(A)–2(C) depict respective plots of the amplitude of the signal produced by the backscattered-electron detector in the configuration of mark and detector shown in FIG. 1(A) and as the beam scans across the right knife edge 51b.
Figure 2B:
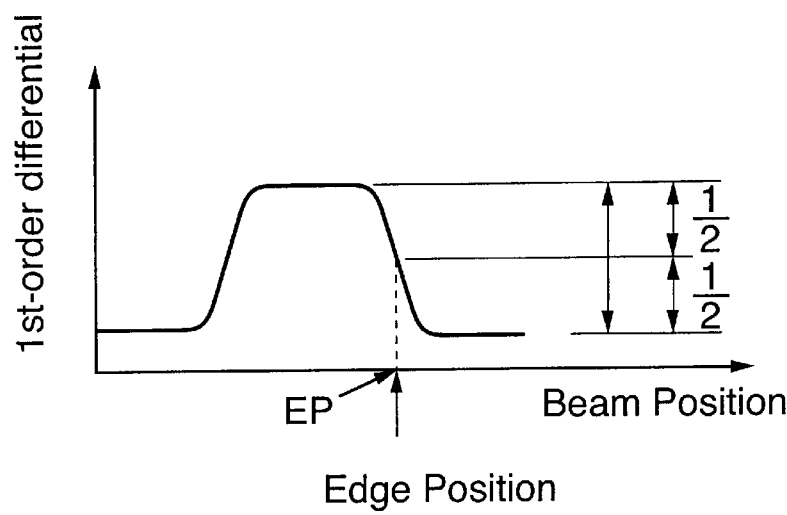
Figure 2C:
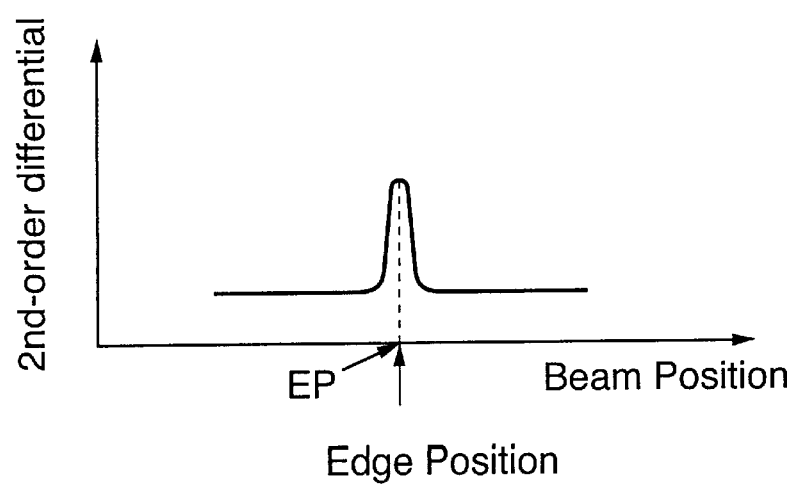

FIGS. 2(A)–2(C) depict respective plots of the amplitude of the signal produced by the backscattered-electron detector 33 in the configuration of the mark 53 or 55 and the backscattered-electron detector 33 shown in FIG. 1(A) as the beam scans across the right knife edge 59b. FIG. 2(A) is a plot of electron-beam intensity; FIG. 2(B) is a plot of the first-order differential of the plot of FIG. 2(A); and FIG. 2(C) is a plot of the second-order differential of the plot of FIG. 2(A).

Beam intensity is greatest whenever the entire illumination beam 51 falls entirely within the aperture 59, as shown in FIG. 1(E). As the illumination beam 51 is moved to the right and begins to traverse the right knife edge 59b of the aperture 59, as shown in FIG. 1(D), the transverse area of the beam 51 transmitted through the aperture 59 decreases and the beam intensity correspondingly drops. In FIG. 2(B), the position on the ordinate representing half the amplitude of the first-order differential (in an area in which the beam intensity is dropping during scanning, i.e., region EP in the figure) is judged to correspond to the position of the beam edge 51a. Alternatively, as shown in FIG. 2(C), the beam position at which the second-order differential of the beam intensity is at its peak value may be regarded as corresponding to the beam edge 51a.

The position of the beam edge 51b is found by scanning the aperture knife edge 59b and the right edge 51b of the illumination beam 51 relative to each other, as shown in FIG. 1(E). The lateral width $b_1$ of the illumination beam 51 is determined by subtracting the detected position of the left edge 51a from the detected position of the right edge 51b. The lateral width $b_2$ of the illumination beam 51 can be determined in a similar manner by scanning the beam edges 51c, 51d and the aperture knife edges 59a relative to each other in the "vertical" direction in FIGS. 1(D) and 1(E).

Thus, the x-direction width and y-direction width of the illumination beam 51 are determined relative to each of the two marks 53, 55 situated at different z-axis positions in the direction of the optical axis. The parallelism of the illumination beam 51 as incident on the mask 10 can be evaluated by comparing these widths at one mark relative to such widths at the other mark. (See Equations (1) and (2), above.) If a difference in the width of the illumination beam 51 as measured at each of the two marks 53, 55 is found, then the power of the lens 9 (FIG. 6) of the illumination optical system can be adjusted as required so as to adjust the illumination beam 51 to be incident orthogonally to the mask 10 in an exactly parallel fashion. Such exact parallel incidence is indicated by the same widths of the illumination beam 51 being found at each mark 53, 55.

Orthogonality of the beam to the mask can be measured by the method disclosed in the Sturans et al. paper cited above.

The backscattered-electron detector 33 also may be situated on or near the top surface of the mask 10 to allow direct detection of charged particles backscattered from each of the marks 53, 55.

The parallelism of the beam incident to the substrate 14 can also be determined. Example Embodiment 2 is directed to this aspect of the invention and is illustrated in FIGS. 3(A)–3(C). FIG. 3(A) is an elevational section of the region between the mask stage and the substrate stage; FIG. 3(B) is an elevational section of certain details of the marks and detector used in this example embodiment; and FIG. 3(C) is a plan view of the transverse profile of a mark.

In FIG. 3(A), an aperture 77 (measuring approximately 1000 $\mu$m×1000 $\mu$m square in this example embodiment) is defined by the mask 10. The aperture 77 is illuminated by an illumination beam 51. Marks 71, 73 are situated on the substrate stage 15 to the left side of the substrate 14 and at different locations along the optical axis AX. Item 75 is a laser mirror for use in conjunction with a laser interferometer (not shown). The beam 79 (representing a portion of the illumination beam 51 passing through the aperture 77) is deflected, demagnified (e.g., by a ratio of ¼), and directed by, inter alia, the projection lens 13 and/or a deflector (not shown) to an individual mark 71, 73 located on the substrate stage 15.

Each mark 71, 73 defines a respective aperture 71a, 73a (each measuring approximately 400 $\mu$m×400 $\mu$m square in this example embodiment). A respective Faraday cup 71b, 73b is provided beneath each aperture 71a, 73a. The portion of the beam 79 that has passed through an aperture 71a, 73a enters and is captured by the respective Faraday cup 71b, 73b, and detected as a corresponding electrical-current signal.

Preferably, at least two of the intersecting edges of the aperture 71a have knife edges, preferably the edges that are used for making measurements according to this example embodiment. The accuracy of the remaining two edges of the mark is unimportant and there is normally no need to provide them with knife edges. The marks 71, 73 are located at different respective "heights" (i.e., positions) along the optical axis AX (FIG. 3(A)).

The mark 71 is positioned in the vicinity of the left edge of the beam 79 by appropriately moving the substrate stage 15. The position of the substrate stage 15 is measured with high accuracy using a laser interferometer (not shown). Further scanning of the beam 79 relative to the mask 71 is performed by beam deflection effected by a deflector calibrated in advance to the laser interferometer. The intensity of the beam passing through the mark 71 is measured using the respective Faraday cup 71b. As the beam traverses (due to beam deflection) the left edge of the mark, a waveform such as shown in FIG. 2(A) is produced (see description above). The mark position at which the first-order differential of the waveform (FIG. 2(B)) is at half-maximum is deemed to be the position of the left edge of the beam 79. Beam-edge position may also be determined as corresponding to the peak value of the corresponding second-order differential (FIG. 2(C)).

The mark 71 is moved relative to the beam 79 by moving the substrate stage 15 such that the same edge of the mark (as used to determine the left edge of the beam) is positioned in the vicinity of the right edge of the beam. A similar measurement as used for the left edge of the beam is then performed for the right edge of the beam. The other two edge positions of the beam 79 are similarly measured. The same measurements as performed for the mark 71 are performed for the mark 73. Thus, a beam-parallelism error at the substrate can be determined by a method similar to that described above in the first example embodiment.

The orthogonality of the beam can be determined by the method described in the Sturans et al. paper cited above.

Figure 4A:
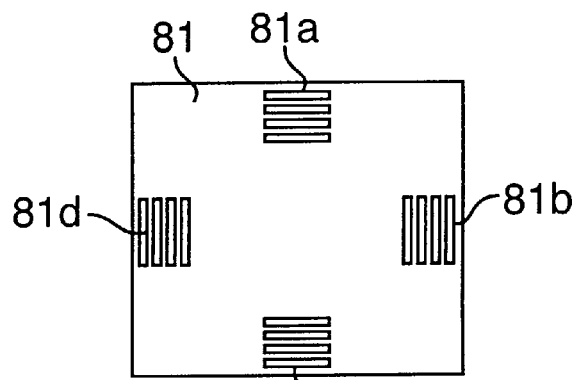
FIGS. 4(A)–4(C) depict certain aspects of the third example embodiment.
Figure 4B:
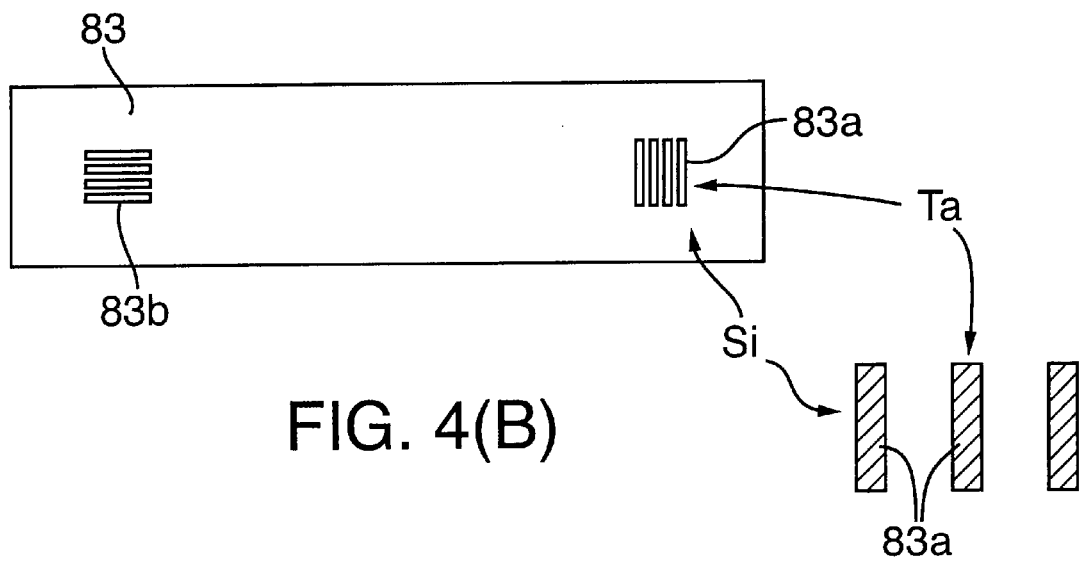
Figure 4C:
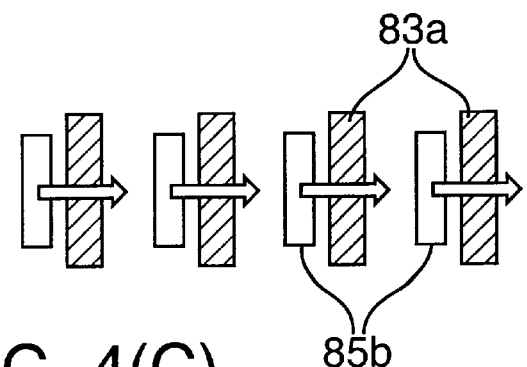
Figure 5A:
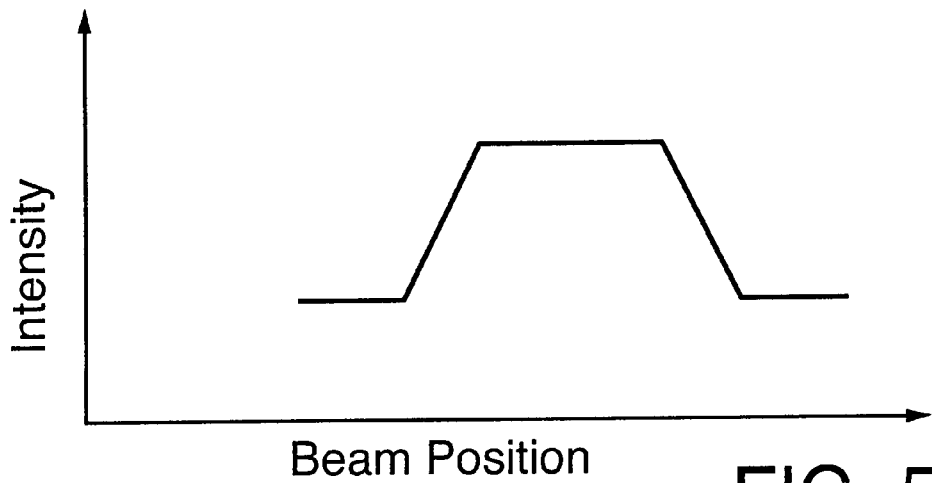
FIGS. 5(A)–5(B) are plots of representative signals obtained during scanning as shown in FIG. 4(C).
Figure 5B:
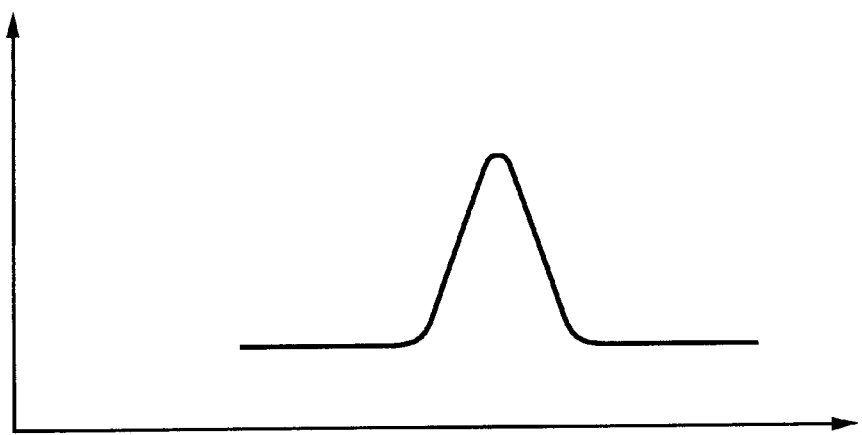

A third example embodiment is illustrated in FIGS. 4(A)–4(C), in which FIG. 4(A) is a plan view of four beamlet patterns (two "x-oriented" beamlet patterns 81a, 81c, and two "y-oriented" beamlet patterns 81b, 81d) situated on a small subfield 81 of a mask or analogous surface located at "mask level"; FIG. 4(B) is a plan view of corresponding marks (a "y-oriented" mark 83a and an "x-oriented" mark 83b) situated on a region ("mark zone") 83 of a substrate or analogous surface located at about "substrate level"; and FIG. 4(C) is a plan view of a mark (the y-oriented mark 83a) being scanned relative to a corresponding beamlet-pattern image (the y-oriented beamlet-pattern image 85b) produced by passage of the charged particle beam through the corresponding beamlet pattern (the y-oriented beamlet pattern 81b). FIGS. 5(A)–5(B) are plots of representative signals obtained during the scanning shown in FIG. 4(C). FIG. 5(A) is a plot of signal intensity, and FIG. 5(B) is a plot of the autocorrelation waveform of the signal.

In this example embodiment, the transverse dimensions of the illumination beam on the mask are, e.g., 1200 $\mu$m×1200 $\mu$m square. As shown in FIG. 4(A), beamlet patterns 81a, 81b, 81c, 81d are situated near respective edges of a, e.g., 1000 $\mu$m×1000 $\mu$m square small mask field 81 situated on the mask or analogous surface at mask level. Each beamlet pattern 81a–81d is individually projected using the projection lenses. If the demagnification ratio is, e.g., ¼, then the image of an irradiated beamlet pattern 81a–81d is demagnified by a factor of four during such projection. The images of the beamlet patterns 81a, 81b, 81c, 81d are denoted 85a, 85b, 85c, 85d, respectively (see FIG. 4(C) showing the beamlet-pattern image 85b of the beamlet pattern 81b).

The beamlet patterns 81a–81d need not be situated within the same small field 81. Alternatively, each beamlet pattern, or a desired combination of beamlet patterns, can be situated in a separate field.

Each beamlet pattern 81a–81d comprises multiple apertures or analogous features for transmitting a corresponding portion of the charged particle beam as a respective beamlet. Each aperture is preferably rectangular in shape and the apertures are preferably equally spaced from each other in each beamlet pattern.

Corresponding marks 83a–83b as shown in FIG. 4(B) are situated on a mark zone 83 located at about a "substrate level" (e.g., at a location on the substrate surface or on the substrate stage). For example, the mark zone 83 shown in FIG. 4(B) comprises a "y-oriented" mark 83a with "vertically" (in the figure) oriented features ("marklets") for use with the y-oriented beamlet-pattern images 85b and 85d, and an "x-oriented" mark 83b with "horizontally" (in the figure) oriented features for use with the beamlet-pattern images 85a, 85c. The marks need not be located within a single mark zone but can alternatively be situated in separate respective mark zones.

The features of each mark 83a, 83b are shaped and spaced from each other so as to correspond with respective portions of the beamlet-pattern image relative to which the mark will be scanned. The marks 83a, 83b can be formed, e.g., by forming a metallic film of tantalum (Ta) or the like on a silicon substrate. A separate set of marks is situated at each of two different locations $Z_1$, $Z_2$ in the z-axis direction at about the substrate level.

To explain mark scanning (FIG. 4(C)), a y-oriented mark 83a is positioned in the vicinity of the y-oriented beamlet-pattern image 85b by moving the substrate stage. The position of the substrate stage is measured with high accuracy using a laser interferometer. The beamlet-pattern image 85b and mark 83a are then scanned relative to each other by lateral deflection of the charged particle beam (which causes the beamlet-pattern image 85b to sweep across the mark 83a, as shown in FIG. 4(C). The deflector used for such beam scanning is calibrated in advance to the laser interferometer.) Charged particles backscattered from the mark 83a are detected as corresponding signals by a backscattered-electron detector (e.g., item 33 in FIG. 1(A)) situated, e.g., on the downstream-facing surface of the projection lens. As the beamlet-pattern image 85b traverses the mark 83a due to beam-deflection scanning, a waveform such as that shown in FIG. 5(A) is produced. When such a waveform is subjected to autocorrelation processing (FIG. 5(B), the maximum is deemed to correspond to exact registration of the beamlet-pattern image 85b with the mark 83a.

Next, the mark 83a is re-positioned by moving the substrate stage so as to place the mark 83a in the vicinity of the other y-oriented beamlet-pattern image 85d of the beamlet pattern 81d. A measurement similar to that described above is then performed. The x-oriented beamlet-pattern images 85a, 85c of the respective beamlet patterns 81a, 81c are similarly scanned but relative to the x-oriented mark 83b. The marks 83a, 83b located at each of the different-height positions $Z_1$, $Z_2$ are scanned in the above-described manner. Any detected parallelism error of the charged particle beam can then be determined by the same method as described in the first example embodiment.

Scanning of the marks can be performed by either beam scanning, stage movement, or a combination thereof. Similar waveforms can be obtained regardless of how scanning is performed.

In an alternative to the third example embodiment, two beamlet patterns (rather than the four shown in FIG. 4(A)) are used. I.e., in this alternative embodiment, one x-oriented and one y-oriented beamlet pattern are used for scanning the x-oriented mark and the y-oriented mark, respectively. The single x-oriented beamlet pattern is moved as required by moving the mask stage to obtain multiple x-position measurements at each location $Z_1$, $Z_2$. (One x-oriented mark and one y-oriented mark are provided at each location $Z_1$, $Z_2$.) Similarly, the single y-oriented beamlet pattern is moved as required by moving the mask stage to obtain multiple y-position measurements at each location $Z_1$, $Z_2$. Actual scanning and obtaining of positional measurements are performed as described above.

In another alternative to the third example embodiment, one x-oriented and one y-oriented beamlet pattern are used for scanning the x-oriented mark and the y-oriented mark, respectively. The single x-oriented beamlet pattern is moved as required by moving the mask stage to obtain multiple x-position measurements at each location $Z_1$, $Z_2$, and the single y-oriented beamlet pattern is moved as required by moving the mask stage to obtain multiple y-position measurements at each location $Z_1$, $Z_2$. In contrast to the alternative configuration described in the preceding paragraph, multiple x-oriented marks and y-oriented marks are provided at each location $Z_1$, $Z_2$. Multiple beamlet-pattern images are projected onto each mark, and each image position is measured relative to the corresponding mark is measured as described above.

In the third example embodiments and two alternatives thereof described above, each beamlet pattern and each corresponding mark are unidirectional (i.e., x-oriented or y-oriented). It is alternatively possible to utilized beamlet patterns and corresponding marks that are bidirectional (i.e., both x-directional and y-directional).

As is clear from the above description, the transverse profile and transverse dimensions of the charged particle beam (as incident on the mask and/or the charged particle beam as incident on the substrate) are measured at positions of different heights along the optical axis. Any of various parameters of the lenses and deflectors of the illumination optical system and/or the projection-optical system can be adjusted so that the measurement results are the same at the two height positions. According to such methods, the parallelism at any position of the illumination beam on the mask side can be adjusted very accurately. This decreases projection aberrations and reduces defocusing and/or distortion of the exposed pattern. In addition, the parallelism of the projected beam incident to the substrate side can be determined very accurately. As a result, image resolution, image positioning, and stitching accuracy of projected subfields can be improved.

Whereas the invention has been described in connection with preferred embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. In a method for transferring a pattern from a mask to a sensitive substrate, in which method the mask defining the pattern is situated on a mask plane illuminated substantially orthogonally with a charged particle beam propagating along an optical axis, and an image of the charged particle beam that has passed through the mask is projection-exposed onto the sensitive substrate situated at a substrate plane, an improvement, comprising the steps:

(a) at each of multiple locations on the mask plane displaced from each other in an optical-axis direction, obtaining a size measurement of a transverse profile of the charged particle beam as incident on the mask;

(b) from data concerning the size measurements obtained in step (a), determining a respective parallelism of the charged particle beam incident to the mask; and (c) based on the determinations obtained in step (b), adjusting the parallelism of the charged particle beam incident to the mask as required to reduce an error in the parallelism found as a result of the determinations.

2. The method of claim 1, further comprising the step, after step (c), of performing a projection-exposure of the substrate with the pattern defined by the mask.

3. In a method for transferring a pattern from a mask to a sensitive substrate, in which method the mask defining the pattern is situated on a mask plane illuminated substantially orthogonally with a charged particle beam propagating along an optical axis, and an image of the charged particle beam that has passed through the mask is projection-exposed onto the sensitive substrate situated at a substrate plane, an improvement, comprising the steps:

(a) at each of multiple locations on the substrate plane displaced from each other in an optical-axis direction, obtaining a size measurement of a transverse profile of the charged particle beam as incident on the substrate;

(b) from data concerning the size measurements obtained in step (a), determining a respective parallelism of the charged particle beam incident to the substrate; and (c) based on the determinations obtained in step (b), adjusting the parallelism of the charged particle beam incident to the substrate as required to reduce an error in the parallelism found as a result of the determinations.

4. The method of claim 3, further comprising the step, after step (c), of performing a projection-exposure of the substrate with the pattern defined by the mask.

5. In a method for transferring a pattern from a mask to a sensitive substrate, in which method the mask defining the pattern is illuminated substantially orthogonally with a charged particle beam propagating along an optical axis, and an image of the charged particle beam that has passed through the mask is projection-exposed onto the sensitive substrate, an improvement, comprising the steps:

(a) providing a first mark at a location ($Z_1$) on the mask or on a mask stage for holding the mask;

(b) providing a second mark at a location ($Z_2$) displaced in an optical-axis direction from the first mark;

(c) directing a charged particle beam along the optical-axis direction at each of the first and second marks, the charged particle beam having a transverse profile having first and second edges;

(d) scanning the charged particle beam and each of the first and second marks separately relative to each other to obtain a positional measurement of a point on each of the first and second edges at each of the first and second marks;

(e) from data concerning the positional measurements obtained in step (d) at each of the first and second marks, determining a respective parallelism of the charged particle beam incident to the mask; and (f) based on the determinations obtained in step (e), adjusting the parallelism of the charged particle beam incident to the mask as required to reduce an error in the parallelism found as a result of the determinations.

6. The method of claim 5, wherein the first and second edges are opposite each other in the transverse profile.

7. The method of claim 6, wherein step (d) comprises scanning the charged particle beam and each of the first and second marks relative to each other in two directions (x) and (y) orthogonal to each other and to the optical axis.

8. The method of claim 7, wherein:

the scanning in step (d) in the two orthogonal directions and at each of the locations ($Z_1$) and ($Z_2$) yields measurements of transverse widths ($X_{z1}$), ($X_{z2}$) of the beam in the x direction at the locations ($Z_1$) and ($Z_2$), respectively, and measurements of transverse widths ($Y_{z1}$), ($Y_{z2}$) of the beam in the y direction at the locations ($Z_1$) and ($Z_2$), respectively; and a beam-parallelism error ($E_x$) in the x direction is determined according to $$E_x = (X_{z2} - X_{z1})/(Z_2 - Z_1)$$

and a beam-parallelism error ($E_y$) in the y direction is determined according to $$E_y = (Y_{z2} - Y_{z1})/(Z_2 - Z_1).$$

9. The method of claim 5, further comprising the step, after step (f), of performing a projection-exposure of the substrate with the pattern defined by the mask.

10. The method of claim 5, wherein the optical axis extends parallel to a z-axis direction, and the mask and substrate each separately extend in orthogonal x-axis and y-axis directions that are perpendicular to the z-axis direction.

11. The method of claim 5, wherein step (d) is performed by directing charged particles passing separately through the first and second marks to a charged-particle detector.

12. The method of claim 11, wherein an edge of the beam is detected by determining a scanning position at which, on a plot of a first-order differential of signal intensity versus beam position, a half-full-amplitude is obtained.

13. In a method for transferring a pattern from a mask to a sensitive substrate, in which method the mask defining the pattern is illuminated substantially orthogonally with a charged particle beam propagating along an optical axis, and an image of the charged particle beam that has passed through the mask is projection-exposed onto the sensitive substrate, an improvement, comprising the steps:
  (a) providing a first mark at a location ($Z_1$) on the substrate or on a substrate stage for holding the substrate;
  (b) providing a second mark at a location ($Z_2$) displaced in an optical-axis direction from the first mark;
  (c) directing a charged particle beam along the optical-axis direction at each of the first and second marks, the charged particle beam having a transverse profile having first and second edges;
  (d) scanning the charged particle beam and each of the first and second marks separately relative to each other to obtain a positional measurement of a point on each of the first and second edges at each of the first and second marks;
  (e) from data concerning the positional measurements obtained in step (d) at each of the first and second marks, determining a respective parallelism of the charged particle beam incident to the substrate; and
  (f) based on the determinations obtained in step (e), adjusting the parallelism of the charged particle beam incident to the substrate as required to reduce an error in the parallelism found as a result of the determinations.

14. The method of claim 13, wherein the first and second edges are opposite each other in the transverse profile.

15. The method of claim 14, wherein step (d) comprises scanning the charged particle beam and each of the first and second marks relative to each other in two directions (x) and (y) orthogonal to each other and to the optical axis.

16. The method of claim 15, wherein:
  the scanning in step (d) in the two orthogonal directions and at each of the locations ($Z_1$) and ($Z_2$) yields measurements of transverse widths ($X_{z1}$), ($X_{z2}$) of the beam in the x direction at the locations ($Z_1$) and ($Z_2$), respectively, and measurements of transverse widths ($Y_{z1}$), ($Y_{z2}$) of the beam in the y direction at the locations ($Z_1$) and ($Z_2$), respectively; and
  a beam-parallelism error ($E_x$) in the x direction is determined according to $$E_x = (X_{z2} - X_{z1})/(Z_2 - Z_1)$$

and a beam-parallelism error ($E_y$) in the y direction is determined according to $$E_y = (Y_{z2} - Y_{z1})/(Z_2 - Z_1).$$

17. The method of claim 13, further comprising the step, after step (f), of performing a projection-exposure of the substrate with the pattern defined by the mask.

18. The method of claim 13, wherein the optical axis extends parallel to a z-axis direction, and the mask and substrate each separately extend in orthogonal x-axis and y-axis directions that are perpendicular to the z-axis direction.

19. The method of claim 13, wherein step (d) is performed by directing charged particles passing separately through the first and second marks to a charged-particle detector.

20. The method of claim 19, wherein an edge of the beam is detected by determining a scanning position at which, on a plot of a first-order differential of signal intensity versus beam position, a half-full-amplitude is obtained.

21. In a method for transferring a pattern from a mask to a sensitive substrate, in which method the mask defining the pattern is illuminated substantially orthogonally with a charged particle beam propagating along an optical axis, and an image of the charged particle beam that has passed through the mask is projection-exposed onto the sensitive substrate, an improvement, comprising the steps:
  (a) at a mask level, providing multiple beamlet patterns, each beamlet pattern, when individually irradiated by a charged particle beam, producing a corresponding downstream beamlet-pattern image having a corresponding transverse profile;
  (b) at a substrate level downstream of the mask level, providing a respective mark zone at each of first and second locations displaced from each other in an optical-axis direction, each mark zone comprising multiple marks, each mark corresponding to the transverse profile of a respective beamlet-pattern image;
  (c) passing a charged particle beam through a first beamlet pattern to produce a first-beamlet-pattern image of the mark zone;
  (d) directing the first beamlet-pattern image produced in step (c) to the respective mark on the mark zone at the first location so as to irradiate the respective mark with the first beamlet-pattern image;
  (e) scanning the first beamlet-pattern image and the respective mark relative to each other to obtain a first beam positional measurement at the first location;
  (f) shifting the mark zone and passing the charged particle beam through a second beamlet pattern to produce a second beamlet-pattern image at the mark zone;
  (g) directing the second beamlet-pattern image produced in step (f) to the respective mark on the mark zone at the first location so as to irradiate the respective mark with the second beamlet-pattern image;
  (h) scanning the second beamlet-pattern image and the respective mark relative to each other to obtain a second beam positional measurement at the first location;
  (i) repeating steps (d)–(h) at the second location;
  (j) from data concerning the positional measurements obtained in steps (e), (h), and (i), determining a respective parallelism of the charged particle beam; and
  (k) based on the determinations obtained in step (j), adjusting the parallelism of the charged particle beam as required to reduce an error in the parallelism found as a result of the determinations.

22. The method of claim 21, wherein the first and second beamlet-pattern images are opposite each other on the mark zone.

23. The method of claim 21, further comprising the step, after step (k), of performing a projection-exposure of the substrate with the pattern defined by the mask.

24. The method of claim 21, wherein:
  in step (a), the multiple beamlet patterns comprise an x-oriented beamlet pattern and a y-oriented beamlet pattern; and in step (b), the multiple marks comprise an x-oriented mark and a y-oriented mark.

25. The method of claim 21, wherein, in step (a), the multiple beamlet patterns are defined in a field on the mask.

26. In a method for transferring a pattern from a mask to a sensitive substrate, in which method the mask defining the pattern is illuminated substantially orthogonally with a charged particle beam propagating along an optical axis, and an image of the charged particle beam that has passed through the mask is projection-exposed onto the sensitive substrate, an improvement comprising the steps:

(a) at a mask level, providing a beamlet pattern having x-oriented features and y-oriented features, the beamlet pattern, when irradiated by the charged particle beam, producing multiple beamlets propagating downstream of the mask;

(b) at each of first and second locations displaced from each other in an optical-axis direction downstream of the mask, providing a mark having x-oriented features and y-oriented features corresponding to respective features of the beamlet pattern;

(c) passing the charged particle beam through he beamlet pattern to produce multiple beamlets propagating downstream of the mask level and to form a respective beamlet-pattern image on the mark;

(d) directing the beamlets produced in step (c) along the optical-axis direction to the mark at each of the first and second locations so as to irradiate each mark with the respective beamlet-pattern image;

(e) at each of the first and second locations, scanning a first beamlet-pattern image of x-oriented features and the respective mark features relative to each other and scanning a second beamlet-pattern image of y-oriented features and the respective mark features relative to each other to obtain a positional measurement of the beamlet-pattern images;

(f) from data concerning the positional measurements obtained in step (e), determining a respective parallelism of the charged particle beam; and (g) based on the determinations obtained in step (f), adjusting the parallelism of the charged particle beam as required to reduce an error of in the parallelism found as a result of the determinations.

27. The method of claim 26, further comprising the step, after step (g), of performing a projection-exposure of the substrate with the pattern defined by the mask.

28. The method of claim 26, wherein:

in step (a), the beamlet pattern comprises a first beamlet pattern consisting of the x-oriented features of the beamlet pattern, and a second beamlet pattern consisting of the y-oriented features of the beamlet pattern; and in step (b), each mark comprises a first mark consisting of the x-oriented features of the mark and a second mark consisting of the y-oriented features of the mark.

29. The method of claim 28, wherein the first and second marks are defined at each location by a mark zone.

30. The method of claim 28, wherein the first and second pattern features are defined by a mask field.

* * * * *

UNITED STATES PATENT AND TRADEMARK OFFICE
CERTIFICATE OF CORRECTION

PATENT NO.     : 6,194,732 B1
DATED          : February 27, 2001
INVENTOR(S)    : Teruaki Okino It is certified that error appears in the above-identified patent and that said Letters Patent is hereby corrected as shown below:

Column 12,
Line 17, change "5(B)" to -- 5(C) --

Column 17,
Line 22, part (c)), change "he" to -- the --

Signed and Sealed this

Seventh Day of May, 2002

Attest:

JAMES E. ROGAN
Attesting Officer          Director of the United States Patent and Trademark Office